(12) United States Patent
Liu et al.

(10) Patent No.: US 8,895,334 B2
(45) Date of Patent: Nov. 25, 2014

(54) THIN FILM TRANSISTOR ARRAY SUBSTRATE AND METHOD FOR MANUFACTURING THE SAME AND ELECTRONIC DEVICE

(75) Inventors: Xiang Liu, Beijing (CN); Jianshe Xue, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/702,115

(22) PCT Filed: Aug. 17, 2012

(86) PCT No.: PCT/CN2012/080321
§ 371 (c)(1),
(2), (4) Date: Dec. 5, 2012

(87) PCT Pub. No.: WO2013/026375
PCT Pub. Date: Feb. 28, 2013

(65) Prior Publication Data
US 2013/0140574 A1 Jun. 6, 2013

(30) Foreign Application Priority Data
Aug. 19, 2011 (CN) .......................... 2011 1 0240510

(51) Int. Cl.
*H01L 29/66* (2006.01)
*H01L 29/786* (2006.01)
*H01L 27/12* (2006.01)
(52) U.S. Cl.
CPC .... *H01L 29/66969* (2013.01); *H01L 29/78693* (2013.01); *H01L 27/1225* (2013.01); *H01L 27/1288* (2013.01)
USPC ............. 438/34; 438/151; 438/149; 438/104; 257/72; 257/59; 257/43; 257/E33.053

(58) Field of Classification Search
USPC ................ 257/72, 59, 43, E33.053, E21.535; 438/34, 151, 149, 104, 689
See application file for complete search history.

(56) References Cited

U.S. PATENT DOCUMENTS

| 2009/0075436 A1* | 3/2009 | Heo et al. ....................... 438/150 |
| 2010/0193790 A1 | 8/2010 | Yeo et al. |

(Continued)

FOREIGN PATENT DOCUMENTS

| CN | 1567029 A | 1/2005 |
| CN | 101794049 A | 8/2010 |

(Continued)

OTHER PUBLICATIONS

International Search Report: dated Nov. 29, 2012; PCT/CN2012/080321.

(Continued)

*Primary Examiner* — Kevin M Picardat
*Assistant Examiner* — Paul Patton
(74) *Attorney, Agent, or Firm* — Ladas & Parry LLP

(57) ABSTRACT

Embodiments of the present invention disclose a thin film transistor array substrate and a method for manufacturing the same and an electronic device. The method for manufacturing the thin film transistor array substrate comprises: a first patterning process, in which a pattern of an active layer which is formed by a semiconductor layer and patterns of a source electrode and a drain electrode, which are separated from each other and are formed by a first metal layer, are formed on a transparent substrate; a second patterning process, in which a pattern of an insulating layer is formed on the transparent substrate subjected to the first patterning process, the pattern of the insulating layer comprising a contact via hole exposing the source electrode; and a third patterning process, in which a pattern of a pixel electrode, which is formed by a transparent conductive layer, and a pattern of a gate electrode, which is formed by a second metal layer, are formed on the transparent substrate subjected to the second patterning process, the pixel electrode being connected to the source electrode through the contact via hole.

20 Claims, 5 Drawing Sheets

(56) References Cited

U.S. PATENT DOCUMENTS

2010/0295049 A1 11/2010 Yoo et al.
2010/0330718 A1* 12/2010 Lee et al. .................. 438/30
2011/0140103 A1* 6/2011 Lee et al. .................. 257/43

FOREIGN PATENT DOCUMENTS

| CN | 101894807 A | 11/2010 |
| CN | 101937144 A | 1/2011 |
| KR | 20080010781 A | 1/2008 |

OTHER PUBLICATIONS

First Chinese Office Action dated Sep. 30, 2013; Appln. No. 201110240510.2.
International Preliminary Report on Patentability dated Feb. 25, 2014; PCT/CN2012/080321.
Second Chinese Office Action dated Mar. 21, 2014; Appln. No. 201110240510.2.
Third Chinese Office Action dated Aug. 15, 2014; Appln. No. 201110240510.2.

* cited by examiner ated rapidly in recent years. In the current market for flat panel displays. TFT-LCDs play a leading role. TFT-LCDs are now being used widely in electronic products of various sizes, which almost involves main electronic products in the current information society, such as liquid crystal televisions, high-resolution digital televisions, computers (including desktop and notebook computers), cell phones, PDAs, GPSs, vehicle-mounted display, projection display, video cameras, digital cameras, electronic watches, calculators, electronic instruments, meters, common display and virtual display, etc.

THIN FILM TRANSISTOR ARRAY SUBSTRATE AND METHOD FOR MANUFACTURING THE SAME AND ELECTRONIC DEVICE

TECHNICAL FIELD

Embodiments of the present invention relate to a thin film transistor array substrate and a method for manufacturing the same and an electronic device.

BACKGROUND

Thin Film Transistor Liquid Crystal Displays (TFT-LCDs) have advantages of small volume, light weight, low power consumption, little radiation, etc., and have been developed rapidly in recent years. In the current market for flat panel displays. TFT-LCDs play a leading role. TFT-LCDs are now being used widely in electronic products of various sizes, which almost involves main electronic products in the current information society, such as liquid crystal televisions, high-resolution digital televisions, computers (including desktop and notebook computers), cell phones, PDAs, GPSs, vehicle-mounted display, projection display, video cameras, digital cameras, electronic watches, calculators, electronic instruments, meters, common display and virtual display, etc.

In recent years, the technology for manufacturing TFT-LCDs has been developed rapidly. For example, the manufacturing of TFT array substrates is developed from a primary seven-patterning process to the current four-patterning process or three-patterning process. Generally, the number of patterning processes during manufacturing is fewer, the production efficiency is higher, and the cost is lower.

At present, upon manufacturing a TFT array substrate, the four-patterning process is usually used, and the three-patterning process is rarely used. This is because a photoresist stripping-off technology is adopted in the three-patterning process in the prior art, and the manufactured TFT array substrate has a relative low yield, which restrains the application of the three-patterning process to the production.

SUMMARY

In an embodiment of the present invention, there is provided a method for manufacturing a thin film transistor (TFT) array substrate, the method comprising: a first patterning process, in which a pattern of an active layer which is formed by a semiconductor layer and patterns of a source electrode and a drain electrode, which are separated from each other and are formed by a first metal layer, are formed on a transparent substrate; a second patterning process, in which a pattern of an insulating layer is formed on the transparent substrate subjected to the first patterning process, the pattern of the insulating layer comprising a contact via hole exposing the source electrode; and a third patterning process, in which a pattern of a pixel electrode, which is formed by a transparent conductive layer, and a pattern of a gate electrode, which is formed by a second metal layer, are formed on the transparent substrate subjected to the second patterning process, the pixel electrode being connected to the source electrode through the contact via hole.

In another embodiment of the invention, there is provided a thin film transistor (TFT) array substrate, comprising: a transparent substrate; an active layer formed on the transparent substrate; a source electrode and a drain electrode which are separated from each other and located on the active layer; an insulating layer, located on the transparent substrate and covering the source electrode, the drain electrode and a part of the active layer located therebetween, the insulating layer comprising a contact via hole which exposes the source electrode; a pixel electrode, located on the insulating layer and electrically connected to the source electrode through the contact via hole; and a gate electrode located on the insulating layer, wherein a transparent conductive layer remains between the gate electrode and the insulating layer.

In still another embodiment of the invention, there is provided an electronic device comprising a thin film transistor array substrate, the thin film transistor array substrate comprising: a transparent substrate; an active layer formed on the transparent substrate; a source electrode and a drain electrode which are separated from each other and located on the active layer; an insulating layer, located on the transparent substrate and covering the source electrode, the drain electrode and a part of the active layer located therebetween, the insulating layer comprising a contact via hole which exposes the source electrode; a pixel electrode, located on the insulating layer and electrically connected to the source electrode through the contact via hole; and a gate electrode located on the insulating layer, wherein a transparent conductive layer remains between the gate electrode and the insulating layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In view of a problem in the prior art that a TFT array substrate manufactured by a three-patterning process has a relative low yield, embodiments of the invention provide a thin film transistor array substrate and a method for manufacturing the same, capable of increasing yield of products when a three-patterning process is used to fabricate the TFT array substrate. Embodiments of the invention also provide an electronic device comprising the above thin film transistor array substrate.

It should be noted that, a patterning process mentioned in embodiments of the invention includes photoresist coating, masking, exposing, developing, etching, photoresist stripping-off and other processes, and a positive photoresist is used as an example of the photoresist, but the invention is not limited thereto.

Figure 1:
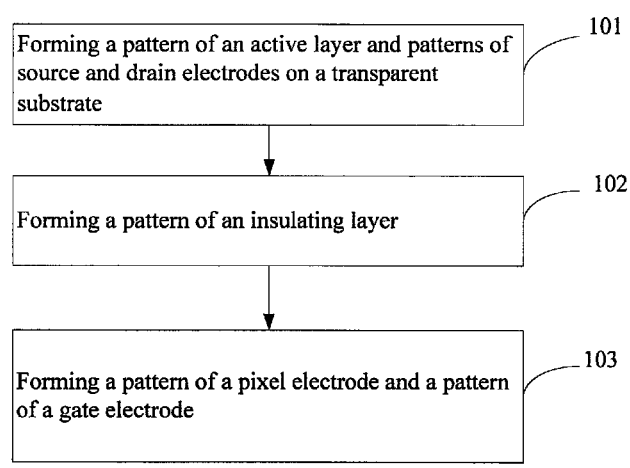
FIG. 1 is a flow chart showing a method for manufacturing a thin film transistor array substrate according to an embodiment of the invention.

FIG. 1 is a flow chart showing a method for manufacturing a thin film transistor array substrate according to an embodiment of the invention. As shown in FIG. 1, the method for manufacturing the thin film transistor array substrate according to this embodiment comprises:

Step 101: a first patterning process, in which a pattern of an active layer which is formed by a semiconductor layer and patterns of a source electrode and a drain electrode, which are separated from each other and are formed by a first metal layer, are formed on a transparent substrate;

Step 102: a second patterning process, in which a pattern of an insulating layer is formed on the transparent substrate subjected to the first patterning process, the pattern of the insulating layer comprising a contact via hole exposing the source electrode;

Step 103: a third patterning process, in which a pattern of a pixel electrode, which is formed by a transparent conductive layer, and a pattern of a gate electrode, which is formed by a second metal layer, are formed on the transparent substrate subjected to the second patterning process, the pixel electrode being electrically connected to the source electrode through the contact via hole.

As described above, in the method for manufacturing the thin film transistor array substrate according to the embodiment of the invention, only three patterning processes are needed to fabricate the TFT array substrate. Because the number of the patterning processes is decreased, the manufacturing time can be decreased, and the manufacturing cost is reduced accordingly. Furthermore, as a flow for manufacturing the entire TFT array substrate is completed by fully using the patterning process in the embodiment of the invention, the manufacturing process is simple and yield can be increased.

Figure 2:
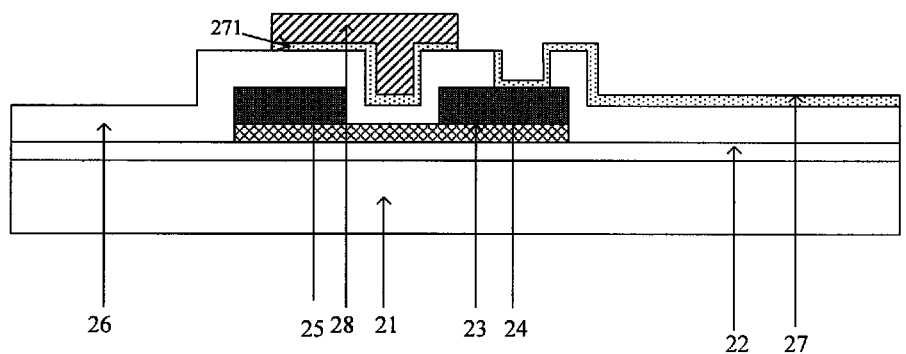
FIG. 2 is a structurally schematic view showing a thin film transistor array substrate according to an embodiment of the invention.

FIG. 2 is a structurally schematic view showing a thin film transistor array substrate according to an embodiment of the invention. As shown in FIG. 2, the thin film transistor array substrate according to this embodiment comprises:

a transparent substrate 21; an active layer 23, which is formed on the transparent substrate 21 and for example, is formed by a semiconductor layer;

a source electrode 24 and a drain electrode 25 separated from each other, which are located on the active layer 23 and for example, is formed by a first metal layer;

an insulating layer 26, which is located on the transparent substrate 21 and covers the source electrode 24, the drain electrode 25 and a part of the active layer 23 exposed therebetween, the insulating layer 26 comprising a contact via hole exposing the source electrode 24;

a pixel electrode 27, which is located on the insulating layer 26 and for example, is formed by a part of a transparent conductive layer, the pixel electrode 27 being electrically connected to the source electrode 24 through the contact via hole; and a gate electrode 28 located on the insulating layer 26, for example, which is formed by a second metal layer, wherein, another part 271 of the transparent conductive layer remains between the gate electrode 28 and the insulating layer 26.

The part of the active layer 23 exposed between the source electrode 24 and the drain electrode 25 which are separated from each other functions as a channel of a thin film transistor. The drain electrode 25 is connected to data lines or integrally formed with the data lines. The gate electrode 28 is connected to gate lines or integrally formed with the gate lines.

In some embodiments of the invention, the thin film transistor array substrate further comprises: a modifying layer 22 located between the transparent substrate 21 and the above semiconductor layer.

In the embodiment of the invention, the semiconductor layer may be a semiconductor material such as amorphous silicon, polysilicon, or the like, or a semiconductor material of metal oxide. The transparent substrate 1 may be a glass substrate, a quartz substrate, a plastic substrate, or the like. The first and second metal layers may be formed by metal such as Cr, W, Ti, Ta, Mo, Al, Cu, or an alloy thereof. The transparent conductive layer may be formed by Indium Tin Oxide (ITO), Indium Zinc Oxide (IZO), or other transparent conductive material.

The thin film transistor array substrate according to the embodiment of the invention is manufactured by using a three-patterning process. Because the number of the patterning processes during manufacturing is decreased, the manufacturing time can be decreased, and the manufacturing cost is reduced accordingly. Furthermore, as the flow for manufacturing the entire TFT array substrate is completed by fully using the patterning process in the embodiment of the invention, the manufacturing process is simple and yield can be increased.

Figure 10:
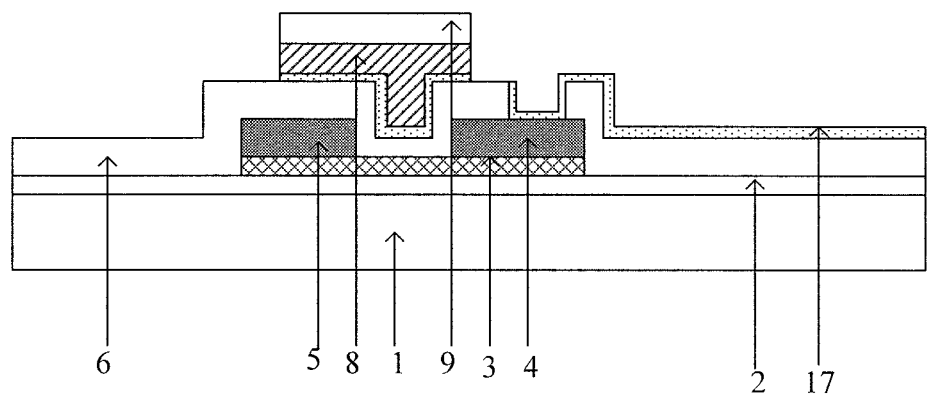
FIG. 10 is a schematically cross-sectional view showing the TFT array substrate subjected to a photoresist-aching in the third patterning process according to the embodiment of the invention.
Figure 11:
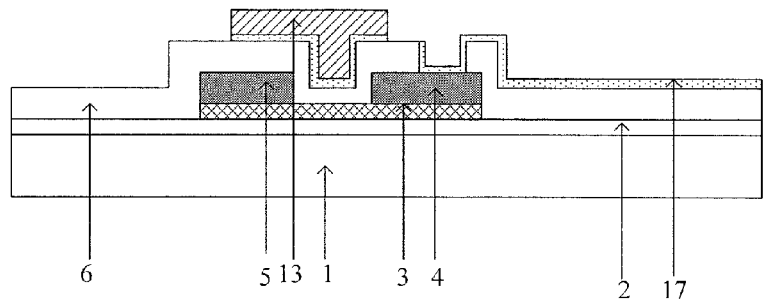
FIG. 11 is a schematically cross-sectional view showing the TFT array substrate subjected to a second etching in the third patterning process according to the embodiment of the invention.
Figure 12:
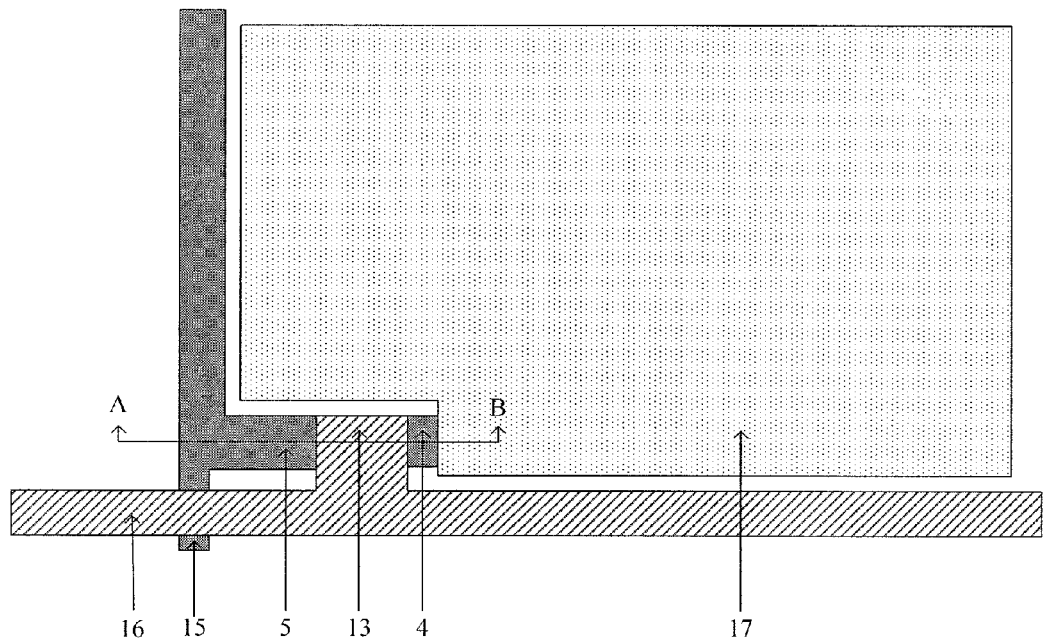
FIG. 12 is schematic plan view showing the manufactured TFT array substrate according to the embodiment of the invention.

Hereinafter, a method for manufacturing a thin film transistor array substrate according to an embodiment of the invention will be explained in detail with reference to FIGS. 3 to 12. A plurality of gate lines and data lines are included on the formed thin film transistor array substrate, and these gate lines and data lines intersect each other to define a plurality of pixels arranged in an array form. FIG. 12 is a schematic view showing one pixel on the formed thin film transistor array substrate. The cross-sectional views of steps shown in FIGS. 3-11 each correspond to a cross-sectional position as indicated by a line A-B in FIG. 12. The method for manufacturing the thin film transistor array substrate according to this embodiment comprises the following steps.

Step 101: a first patterning process, in which a pattern of an active layer which is formed by a semiconductor layer and patterns of a source electrode and a drain electrode, which are separated from each other and are formed by a first metal layer, are formed on a transparent substrate.

Figure 3:
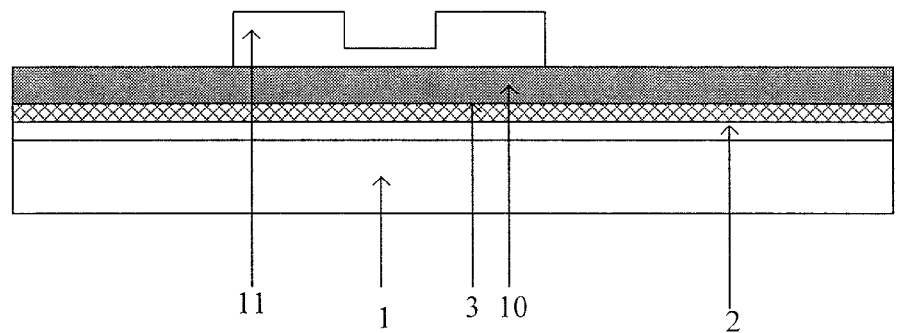
FIG. 3 is a schematically cross-sectional view showing a TFT array substrate subjected to exposure and development by using a gray-tone or half-tone mask in a first patterning process according to an embodiment of the invention.
Figure 4:
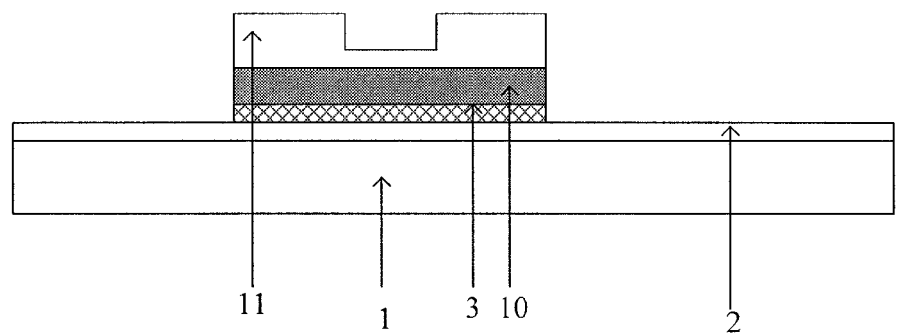
FIG. 4 is a schematically cross-sectional view showing the TFT array substrate subjected to a first etching in the first patterning process according to the embodiment of the invention.
Figure 5:
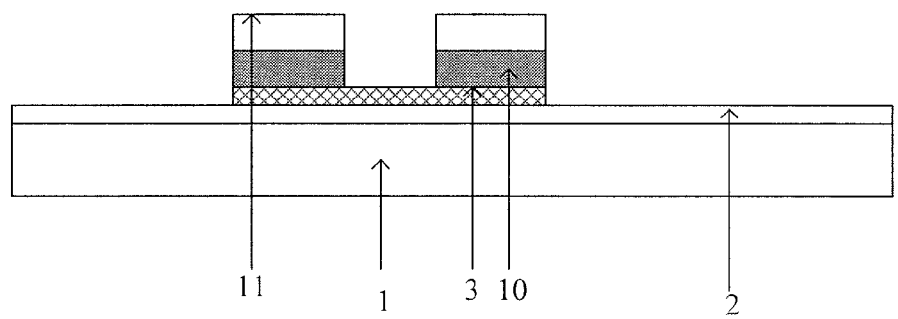
FIG. 5 is a schematically cross-sectional view showing the TFT array substrate subjected to a photoresist-ashing in the first patterning process according to the embodiment of the invention.
Figure 6:
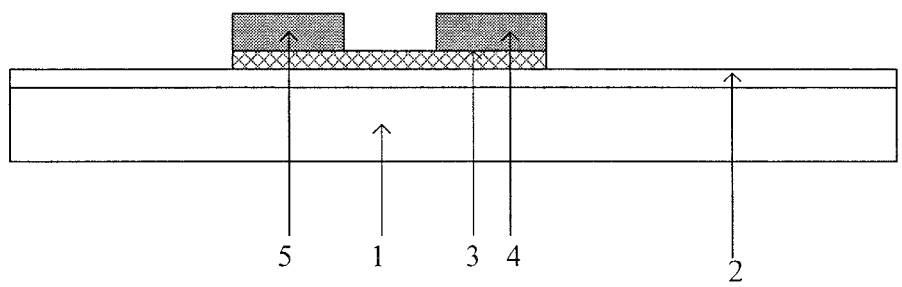
FIG. 6 is a schematically cross-sectional view showing the TFT array substrate subjected to a second etching in the first patterning process according to the embodiment of the invention.

Firstly, a modifying layer 2 with a thickness of such as 500 to 2000 Å is deposited on a transparent substrate 1, for example, by using a Plasma Enhanced Chemical Vapor Deposition (PECVD) method, next, a metal oxide semiconductor layer 3 with a thickness of such as 300 to 1500 Å and a source and drain metal layer 10 with a thickness of 2000 to 3000 Å are sequentially deposited thereon by sputtering or thermal evaporation, and further, a photoresist layer is coated thereon and then the photoresist layer is exposed and developed by using a half-tone mask (not shown) to form a photoresist mask 11, thereby forming a structure as shown in FIG. 3. The half-tone mask is a double-tone mask, and thus the photoresist layer exposed by using the half-tone mask usually includes a fully-exposed region, a partially-exposed region and non-exposed region. And, after developing, the photoresist in the fully-exposed region is fully removed, the photoresist in the non-exposed region is fully retained, and the photoresist in the partially-exposed region is partially removed in a thickness direction, thereby forming the photoresist mask 11 as shown in FIG. 3. The source and drain metal layer 10 and the metal oxide semiconductor layer 3 in the fully-exposed region are etched off by one etching process, so as to form a structure as shown in FIG. 4. Subsequently, one photoresist-ashing process is performed, so as to remove the photoresist in the partially-exposed region, i.e. photoresist in a TFT channel region, and then one dry etching process (for example, a reactive ion etching (RIE)) is performed, so as to remove the source and drain metal layer 10 in the TFT channel region, thereby forming a structure as shown in FIG. 5. Next, the remaining photoresist mask 11 is removed, and then a plasma treatment is performed to enhance properties of TFTs, so that a structure shown in FIG. 6 is finally formed and the manufacturing of the pattern of an active layer and the source electrode 4 and the drain electrode 5 which are separated from each other is completed. In the embodiment, the source electrode 5 and data lines 15 (refer to FIG. 12) are integrally formed with each other.

In the embodiment of the invention, the modifying layer 2 may be formed by silicon oxide, and corresponding reactive gases may be $SiH_4$ and $N_2O$; the metal oxide semiconductor layer 3 may be formed by amorphous Indium Gallium Zinc Oxide (IGZO) or other metal oxide; and the source and drain metal layer 10 (namely, the first metal layer in the above embodiments) may be formed by metal such as Cr, W, Ti, Ta, Mo, Al, Cu, or an alloy thereof. The source and drain metal layer 10 may be a single layer, or may also be a multilayer.

In the embodiment, the modifying layer is firstly formed on the transparent substrate, so as to avoid a case where a TFT channel contacts the transparent substrate directly to form a poor interface. However, the modifying layer may be omitted. The semiconductor layer is formed by a metal oxide semiconductor such as IGZO, and thus a photocurrent will not generated when the semiconductor layer is irradiated by a visible light. Therefore, it is unnecessary to use a light shielding layer below; and the light shielding layer may also be formed if necessary.

As can be understood by those skilled in the art, the first patterning process for performing the step 101 is not limited to the above scheme. For example, in the above step, other double-tone mask, such as a gray-tone mask, may also be used to replace the half-tone mask.

Step 102: a second patterning process, in which a pattern of an insulating layer is formed on the transparent substrate subjected to the first patterning process, the pattern of the insulating layer comprising a contact via hole exposing the source electrode.

Figure 7:
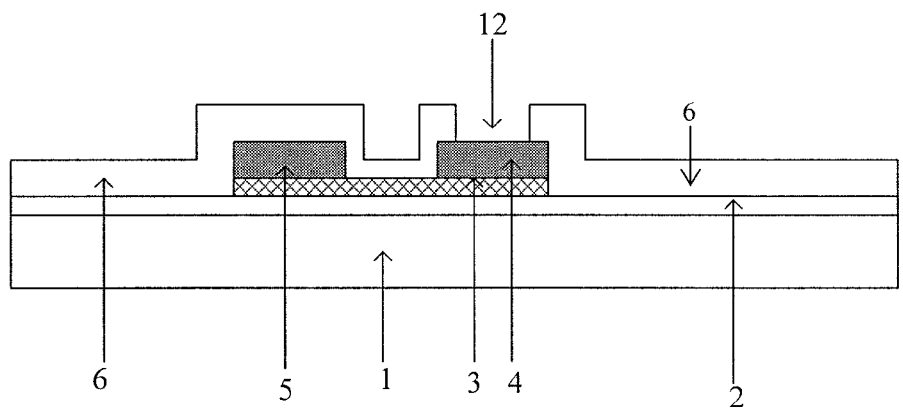
FIG. 7 is a schematically cross-sectional view showing the TFT array substrate subjected to a second patterning process according to the embodiment of the invention.

On the transparent substrate subjected to the step 101, an insulating layer 6 with a thickness of such as 1000 to 4000 Å is continuously deposited, for example, by using a PECVD method. In the embodiment of the invention, the insulating layer 6 may be formed by oxide, nitride or oxynitride, and corresponding reactive gases may be $SiH_4$, $NH_3$, $N_2$ or $SiH_2Cl_2$, $NH_3$, N2. Next, the insulating layer 6 is etched by using one patterning process, for example, by dry etching, so as to form a contact via hole 12 electrically connected to the source electrode 4. Accordingly, a structure as shown in FIG. 7 is formed.

In the embodiment of the invention, the insulating layer may be a single layer, and may also be two or more layers. If two insulating layers are used, one of the insulating layers contacting the semiconductor layer is deposited at a low speed, and the other is deposited at a high speed. In this way, it can form a good interface with the semiconductor layer to thereby facilitate enhancement of properties of TFTs, and meanwhile, the production efficiency of the TFT array substrate can also be increased.

As can be understood by those skilled in the art, the second patterning process for performing the step 102 is not limited to the above scheme. For example, in the above step, a wet etching may also be used to etch the insulating layer, so as to replace the dry etching.

Figure 8:
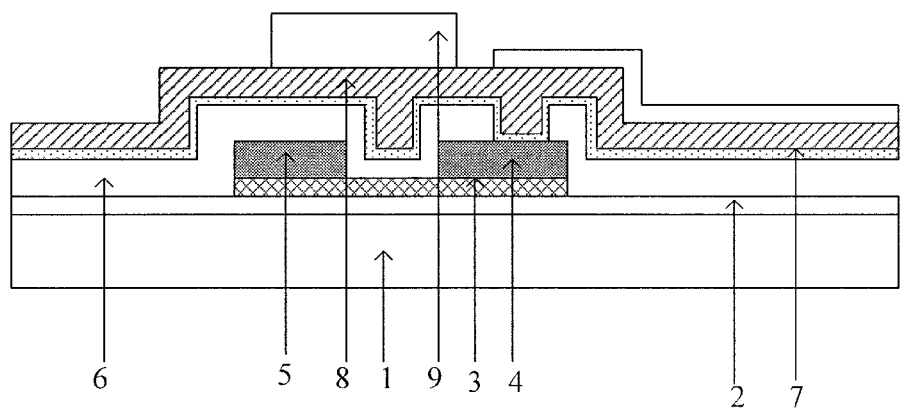
FIG. 8 is a schematically cross-sectional view showing the TFT array substrate subjected to exposure and development by using a gray-tone or half-tone mask in a third patterning process according to the embodiment of the invention.
Figure 9:
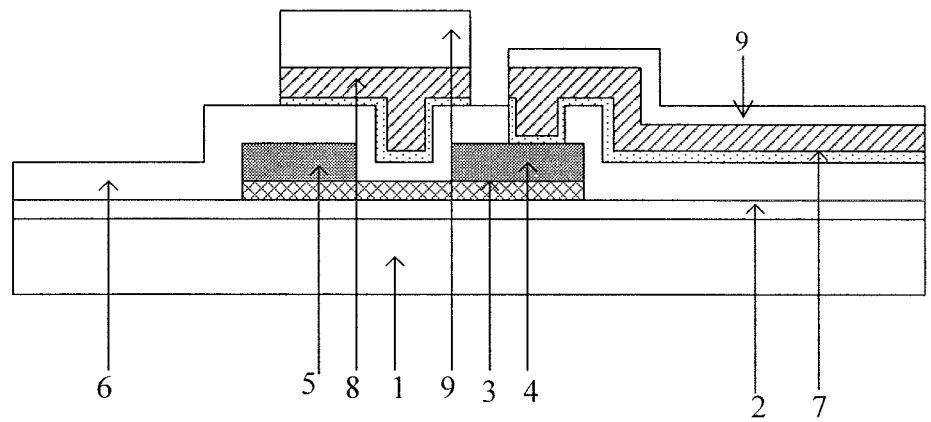
FIG. 9 is a schematically cross-sectional view showing the TFT array substrate subjected to a first etching in the third patterning process according to the embodiment of the invention.

Step 103: a third patterning process, in which a pattern of a pixel electrode, which is formed by a transparent conductive layer, and a pattern of a gate electrode, which is formed by a second metal layer, are formed on the transparent substrate subjected to the second patterning process, the pixel electrode being electrically connected to the source electrode through the contact via hole.

a transparent conductive layer 7 having a thickness of 300 to 2000 Å and a gate metal layer 8 are sequentially deposited on the transparent substrate subjected to the step 102 by sputtering or thermal evaporation, and further, a photoresist layer is coated thereon and then the photoresist layer is exposed and developed by using another half-tone mask (not shown) to form a photoresist mask 9, thereby forming a structure as shown in FIG. 8. In the embodiment of the invention, the transparent conductive layer 7 may be formed by ITO or IZO, or may be formed by other metal or metal oxide; the gate metal layer 8 (namely, the second metal layer in the above embodiments) may be formed by metal such as Cr, W, Ti, Ta, Mo, Al, Cu, or an alloy thereof. The gate metal layer 8 may be a single layer, or may also be a multilayer. Subsequently, the gate metal layer 8 and the transparent conductive layer 7 in a fully-exposed region are etched off by one etching process, so as to form a structure shown in FIG. 9. Next, one photoresist-ashing process is performed, so as to remove the photoresist in a partially-exposed region, and then another one dry etching process is performed, so that the gate metal layer 8 in the partially-exposed region is removed, a pixel electrode 17 is exposed, and thus a structure as shown in FIG. 10 is formed. Subsequently, the remaining photoresist mask 9 is removed and thus a structure as shown in FIG. 11 is formed, so as to complete manufacturing of the gate electrode 13. In the embodiment, the gate electrode 13 is integrally formed with gate lines 16.

The manufacturing of the semiconductor layer and the source and drain metal pattern is finally completed. FIG. 12 is a schematic plan view showing the TFT array substrate manufactured by the embodiment of the invention. As shown, data lines 15 and gate lines 16 intersect each other to define a plurality of pixel regions; and each of the pixel regions comprises a thin film transistor functioning as a switch element located at a position where the data line 15 and the gate line 16 intersect each other, and the pixel electrode 17 for applying an electric field for display.

As can be understood by those skilled in the art, the third patterning process for performing the step 103 is not limited to the above scheme. For example, in the above step, other double-tone mask such as a gray-tone mask may also be used to replace the half-tone mask.

In the embodiment of the invention, only three patterning processes are needed to fabricate the TFT array substrate. Because the number of the patterning process is decreased, the manufacturing time can be decreased, and the manufacturing cost is reduced accordingly. Furthermore, as the flow for manufacturing the entire TFT array substrate is completed by fully using the patterning process in the embodiment of the invention, the manufacturing process is simple and yield can be increased.

Embodiments of the invention also provide an electronic device, comprising the above thin film transistor array substrate. In some embodiments of the invention, for example, the electronic device may be a liquid crystal panel, an electronic paper display panel, a liquid crystal television, an electronic reader, etc.

At last, it should be noted that, the forgoing embodiments are merely used to explain the technical solutions of the invention, but not limitations on them. Although the invention is described in detail with reference to the above embodiments, as would be appreciated by those ordinarily skilled in the art, they can make modifications to the technical solutions recorded by the above embodiments or make equivalent replacements to a part of technical features therein; and these modifications or replacements do not make the essence of a corresponding technical solution departing from the spirit and scope of the present disclosure.

The invention claimed is:

1. A method for manufacturing a thin film transistor array substrate, comprising:
a first patterning process, in which a pattern of an active layer which is formed by a semiconductor layer and patterns of a source electrode and a drain electrode, which are separated from each other and are formed by a first metal layer, are formed on a transparent substrate;
a second patterning process, in which a pattern of an insulating layer is formed on the transparent substrate subjected to the first patterning process, the pattern of the insulating layer comprising a contact via hole exposing the source electrode; and
a third patterning process, in which a pattern of a pixel electrode, which is formed by a transparent conductive layer, and a pattern of a gate electrode, which is formed by a second metal layer, are formed on the transparent substrate subjected to the second patterning process, the pixel electrode being connected to the source electrode through the contact via hole.

2. The method for manufacturing the thin film transistor array substrate according to claim 1, wherein, the first patterning process comprises:

depositing a semiconductor layer and a first metal layer on the transparent substrate sequentially;
coating a photoresist layer on the first metal layer; and
etching after performing an exposing and developing process on the photoresist layer by using a double-tone mask so as to form the pattern of the active layer which is formed by the semiconductor layer, and then etching after performing an ashing process on the photoresist layer so as to form the patterns of the source electrode and the drain electrode, which are separated from each other and are formed by the first metal layer, on the pattern of the active layer.

3. The method for manufacturing the thin film transistor array substrate according to claim 2, wherein, the photoresist is partially removed in a thickness direction by the ashing process.

4. The method for manufacturing the thin film transistor array substrate according to claim 2, wherein, the depositing of the semiconductor layer and the first metal layer on the transparent substrate sequentially comprises:
the semiconductor layer with a thickness of 300 to 1500 Å and the first metal layer with a thickness of 2000 to 3000 Å are sequentially deposited on the transparent substrate by sputtering or thermal evaporation.

5. The method for manufacturing the thin film transistor array substrate according to claim 1, wherein, a modifying layer is formed on the transparent substrate prior to the first patterning process.

6. The method for manufacturing the thin film transistor array substrate according to claim 5, wherein, the modifying layer with a thickness of 500 to 2000 Å is deposited on the transparent substrate by using a plasma enhanced chemical vapor deposition method.

7. The method for manufacturing the thin film transistor array substrate according to claim 1, wherein, the second patterning process comprises:
depositing an insulating layer with a thickness of 1000 to 4000 Å on the transparent substrate subjected to the first patterning process by using a plasma enhanced chemical vapor deposition method;
coating a photoresist layer on the insulating layer; and
etching after performing an exposing and developing process on the photoresist layer by using a mask, so as to form the contact via hole over the source electrode.

8. The method for manufacturing the thin film transistor array substrate according to claim 1, wherein, the third patterning process comprises:
depositing a transparent conductive layer having a thickness of 300 to 2000 Å and the second metal layer on the transparent substrate subjected to the second patterning process by using a sputtering or thermal evaporation method;
coating a photoresist layer on the second metal layer; and
etching after performing an exposing and developing process on the photoresist layer by using a double-tone mask, so as to form the pattern of the gate electrode, and then etching after performing an ashing process on the photoresist layer, so as to form the pattern of the pixel electrode.

9. The method for manufacturing the thin film transistor array substrate according to claim 1, wherein, the semiconductor layer is made of a metal oxide.

10. The method for manufacturing the thin film transistor array substrate according to claim 9, wherein, the metal oxide comprises IGZO.

11. The method for manufacturing the thin film transistor array substrate according to claim 2, wherein, the modifying layer is made of silicon oxide; and
the first metal layer contains at least one metal selected from a group consisting of Cr, W, Ti, Ta, Mo, Al and Cu, or an alloy thereof.

12. The method for manufacturing the thin film transistor array substrate according to claim 1, wherein, the insulating layer is made of oxide, nitride oroxynitride.

13. The method for manufacturing the thin film transistor array substrate according to claim 7, wherein, the insulating layer is made of oxide, nitride or oxynitride.

14. The method for manufacturing the thin film transistor array substrate according to claim 1, wherein, the transparent conductive layer is made of IZO or ITO; and
the second metal layer contains at least one metal selected from a group consisting of Cr, W, Ti, Ta, Mo, Al and Cu, or an alloy thereof.

15. A thin film transistor array substrate, comprising:
a transparent substrate;
an active layer formed on the transparent substrate;
a source electrode and a drain electrode separated from each other, which are located on the active layer;
an insulating layer, which is located on the transparent substrate and covers the source electrode, the drain electrode and a part of the active layer located therebetween, the insulating layer comprising a contact via hole exposing the source electrode;
a pixel electrode, which is located on the insulating layer, the pixel electrode being electrically connected to the source electrode through the contact via hole; and
a gate electrode located on the insulating layer, wherein, a transparent conductive layer for forming the pixel remains between the gate electrode and the insulating layer.

16. The thin film transistor array substrate according to claim 15, further comprising: a modifying layer located between the transparent substrate and the semiconductor layer.

17. The thin film transistor array substrate according to claim 15, wherein, the semiconductor layer is made of a metal oxide.

18. An electronic device comprising a thin film transistor array substrate, the thin film transistor array substrate comprising:
a transparent substrate;
an active layer formed on the transparent substrate;
a source electrode and a drain electrode which are separated from each other and located on the active layer;
an insulating layer, located on the transparent substrate and covering the source electrode, the drain electrode and a part of the active layer located therebetween, the insulating layer comprising a contact via hole which exposes the source electrode;
a pixel electrode, located on the insulating layer and electrically connected to the source electrode through the contact via hole; and
a gate electrode located on the insulating layer, wherein a transparent conductive layer for forming the pixel electrode remains between the gate electrode and the insulating layer.

19. The electronic device according to claim 18, wherein the thin film transistor array substrate further comprises: a modifying layer located between the transparent substrate and the semiconductor layer.

20. The electronic device according to claim 18, wherein the semiconductor layer is made of a metal oxide.

* * * * *